(12) United States Patent
Coolbaugh et al.

(10) Patent No.: US 7,285,472 B2
(45) Date of Patent: Oct. 23, 2007

(54) LOW TOLERANCE POLYSILICON RESISTOR FOR LOW TEMPERATURE SILICIDE PROCESSING

(75) Inventors: Douglas D. Coolbaugh, Essex Junction, VT (US); John E. Florkey, Pleasant Valley, NY (US); Robert M. Rassel, Colchester, VT (US)

(73) Assignee: International Business Machines Corporation, Armonk, NY (US)

( * ) Notice: Subject to any disclaimer, the term of this patent is extended or adjusted under 35 U.S.C. 154(b) by 52 days.

(21) Appl. No.: 10/905,940

(22) Filed: Jan. 27, 2005

(65) Prior Publication Data

US 2006/0166454 A1    Jul. 27, 2006

(51) Int. Cl.
*H01L 21/8222* (2006.01)

(52) U.S. Cl. .................. 438/330; 438/332; 438/381; 438/382

(58) Field of Classification Search ........... 438/171, 438/190, 238, 329, 330, 332, 381, 382
See application file for complete search history.

(56) References Cited

U.S. PATENT DOCUMENTS

| 3,656,115 | A | 4/1972 | Foerster |
| 4,467,519 | A | 8/1984 | Glang et al. |
| 4,502,894 | A | 3/1985 | Seto et al. |
| 5,051,615 | A | 9/1991 | Rosenthal |
| 5,185,294 | A | 2/1993 | Lam et al. |
| 5,206,623 | A | 4/1993 | Rochette et al. |
| 5,235,335 | A | 8/1993 | Hester et al. |
| 5,567,977 | A | 10/1996 | Jimenez |
| 6,104,235 | A | 8/2000 | Monti et al. |
| 6,261,916 | B1* | 7/2001 | Re et al. ..................... 438/385 |
| 6,313,728 | B1* | 11/2001 | Smith et al. .................. 338/34 |
| 6,351,021 | B1 | 2/2002 | Hemmenway et al. |
| 6,376,896 | B1* | 4/2002 | Shiiki et al. ................ 257/538 |
| 6,436,747 | B1* | 8/2002 | Segawa et al. ............ 438/197 |
| 6,489,881 | B1 | 12/2002 | Aleksandravivius et al. |
| 2001/0010937 | A1 | 8/2001 | Lin et al. |
| 2002/0033519 | A1 | 3/2002 | Babcock et al. |
| 2003/0207544 | A1 | 11/2003 | Shimamoto et al. |
| 2005/0070102 | A1* | 3/2005 | Coolbaugh et al. ......... 438/689 |
| 2005/0250278 | A1* | 11/2005 | Randolph ................... 438/210 |
| 2006/0035426 | A1* | 2/2006 | Weiss et al. ................ 438/199 |
| 2006/0046418 | A1* | 3/2006 | Coolbaugh et al. ......... 438/382 |
| 2006/0166457 | A1* | 7/2006 | Liu et al. ................... 438/400 |

* cited by examiner

*Primary Examiner*—Thao P. Le
(74) *Attorney, Agent, or Firm*—Scully, Scott, Murphy & Presser, P.C.; William D. Sabo, Esq.

(57) ABSTRACT

Various methods of fabricating a high precision, silicon-containing resistor in which the resistor is formed as a discrete device integrated in complementary metal oxide semiconductor (CMOS) processing utilizing low temperature silicidation are provided. In some embodiments, the Si-containing layer is implanted with a high dose of ions prior to activation. The activation can be performed by the deposition of a protective dielectric layer, or a separate activation anneal. In another embodiment, a highly doped in-situ Si-containing layer is used thus eliminating the need for implanting into the Si-containing layer.

19 Claims, 7 Drawing Sheets

LOW TOLERANCE POLYSILICON RESISTOR FOR LOW TEMPERATURE SILICIDE PROCESSING

RELATED APPLICATIONS

This application is related to co-pending and co-assigned U.S. application Ser. No. 10/605,439, filed Sep. 30, 2003, entitled "PRECISION POLYSILICON RESISTOR PROCESS". The entire content of the aforementioned U.S. Application is incorporated herein by reference.

FIELD OF THE INVENTION

The present invention relates to semiconductor integrated circuits (ICs), and more particularly to methods of fabricating a high precision, silicon-containing resistor in which the resistor is formed as a discrete device integrated in low temperature complementary metal oxide semiconductor (CMOS) processing.

BACKGROUND OF THE INVENTION

Polycrystalline silicon resistors, also called polysilicon or polySi resistors, have been used in the electronic circuit industry for many years. Depending upon their doping and doping levels, p+, n+, p− and n− polysilicon resistors can be fabricated. Resistors including p+ polysilicon are extremely advantageous for use in analog circuit designs due to their desirable figures of merits. Typically, p+ polysilicon resistors are used in analog and mixed signal circuit designs because they can provide precise matching of subsequent resistors, a low temperature coefficient of resistance, a low voltage coefficient of resistance, and a low parasitic capacitance.

Although polysilicon resistors are widely used in analog circuit designs, such resistors generally have high sheet resistance tolerances ranging from 15-20%. This means the sheet resistance changes by +/−15 to 20%. In current analog and mixed signal applications, and in order to meet stringent circuit performance requirements, circuit designers are demanding lower tolerances in polysilicon resistors.

In the current state of the art, polysilicon resistors are fabricated by ion implanting dopants into a polysilicon layer during the source/drain (S/D) implant step and/or emitter implant step. The implanted dopants in the various regions are then activated utilizing a rapid thermal anneal process. Next, a dielectric layer such as a nitride is applied to the body of the polysilicon resistor so as to protect the body of the polysilicon resistor from being silicided in a subsequent silicidation step.

The ends of the polysilicon resistors are then typically exposed and silicided by employing a conventional silicidation process that includes depositing a metal atop the exposed polysilicon end portions and annealing. A single or two-step anneal process may be used in forming the silicide depending on the type of metal that is deposited. The two-step anneal typically includes a silicidation formation anneal and a silicidation transformation anneal. During the annealing step, the resistance of the polySi resistor typically changes such that the resistance value no longer meets a predetermined and required resistance value.

Other thermal cycles besides the silicidation anneals (e.g., formation anneal and transformation anneal) can also adversely affect the resistance of a polysilicon resistor. For example, the anneal used to activate dopants within the source/drain regions, the temperature of various materials being deposited atop the doped polysilicon layer, and gate sidewalls oxidations can also change the resistance value such that it no longer meets a predetermined specification.

Co-assigned and co-pending U.S. application Ser. No. 10/605,439, filed Sep. 30, 2003 describes processes for fabricating high precision polysilicon resistors which can avoid some of the problems, particularly the change in resistance, that are caused by the thermal cycling mentioned above. In particular, and in an embodiment of the '439 application, the precision resistor is formed by performing a rapid thermal anneal for an emitter/FET activation process on a wafer or chip having a partially formed polysilicon resistor having a polysilicon layer, depositing a protective layer over the polysilicon layer to protect the polysilicon layer against subsequent silicide processing, ion implanting a dopant into the polysilicon layer through the protective layer, and performing silicide processing to form the precision polysilicon resistor.

With respect to this embodiment disclosed in the '439 application, the prior art technique requires that the implanted dopants within the polysilicon layer be activated by the silicidation anneal. The activation of the dopants within the polysilicon layer is possible using the second method disclosed in the '439 application when the silicide anneal is performed at temperatures greater than 700° C. However, for low temperature silicidation processes in which the anneal temperature is less than 700° C., preferably less than 400° C., the method disclosed in the '439 application does not work very effectively since the low silicidation temperatures are not capable of fully activating the dopants within the polysilicon layer. Hence, the resultant resistor would exhibit some resistance variation caused by further thermal processes.

In view of the above drawbacks with the prior art processes of fabricating Si-containing resistors, e.g., polysilicon or polySiGe, particularly the difficulties in controlling the resistance of resistors, there is a need for developing a new and improved method in which resistors, including polySi or polySiGe resistors, can be fabricated that exhibit less sheet resistance variation than compared to conventional polysilicon resistors.

SUMMARY OF THE INVENTION

The present invention provides methods of fabricating a high precision Si-containing resistor wherein the resistor is formed as a discrete device integrated in a complementary metal oxide semiconductor (CMOS) process that utilizes a low temperature silicide process (on the order of about 700° C. or less). The methods of the present invention overcome the drawbacks mentioned with prior art processes, including the problems mentioned above in connection with the '439 application. Thus, and in some respects, the present invention improves upon the method disclosed in the '439 application.

In accordance with a first method of the present invention, a high precision Si-containing containing resistor can be fabricated using the following processing steps:

providing a structure that includes at least one resistor device region and at least one other type of device region, wherein said at least one resistor device region comprises a Si-containing layer and said at least one other type of device region having activated dopant regions formed therein;

implanting a first conductivity type dopant at an ion dose of about 1E14($10^{14}$) atoms/cm$^2$ or greater into said Si-containing layer, and forming a protective dielectric layer atop said Si-containing layer in the at least one resistor device region at a temperature that activates said first conductivity type dopant within the Si-containing layer.

A silicidation process may follow the forming of the protective dielectric layer. In some embodiments, the silicidation process can be used to partially activate the dopants within the Si-containing layer. In an embodiment of this method of the present invention, the high ion dose implant step can be avoided and thus eliminated, if a highly doped in-situ Si-containing layer is used. The term "highly doped" denotes a dopant concentration of about $10^{20}$ (i.e., 1E20) atoms/cm$^3$ or greater.

A second method of the present invention includes the steps of:
 providing a structure that includes at least one resistor device region and at least one other type of device region, wherein said at least one resistor device region comprises a Si-containing layer and said at least one other type of device region having activated dopant regions formed therein;
 forming a protective dielectric layer atop said Si-containing layer in the at least one resistor device region;
 implanting a first conductivity type dopant into said Si-containing layer;
 performing an activation anneal on said Si-containing layer; and
 performing a silicide process at a temperature of about 700° C. or less.

In one embodiment of the second method, the silicide process is a NiSi process that is performed at a temperature of about 400° C. or less.

A third method of the present invention comprises the steps of:
 providing a structure that includes at least one resistor device region and at least one other type of device region, wherein said at least one resistor device region comprises a Si-containing layer and said at least one other type of device region has an inactivated dopant region;
 implanting a first conductivity type dopant into said Si-containing layer at an ion dose of about 1E16 atoms/cm$^2$ or greater; and
 subjecting said structure to an activation anneal, wherein said activation anneal activates the first conductivity type dopant within the Si-containing layer as well as the inactivated dopant region.

A protective dielectric layer and a silicidation process may follow the activation anneal step in the third method of the present invention.

DETAILED DESCRIPTION OF THE INVENTION

The present invention, which provides processes for fabricating a precision Si-containing resistor that exhibits less sheet resistance variation than observed for a conventional Si-containing resistor, will now be described in greater detail by referring to the various drawings that accompany the present application. The drawings are provided herein for illustrative purposes and thus they are not drawn to scale.

Moreover, the drawings of the present invention show a fragment of a semiconductor wafer or chip in which only one resistor device region is shown. Although the drawings show the presence of only a single resistor device region, the present processes can be used in forming a plurality of resistors across different resistor device regions on the surface of a single semiconductor chip or wafer. Other device regions including bipolar transistors and/or CMOS devices, such as FETs, can be formed to the periphery of the resistor device region shown in the drawings of the present application. The different types of device regions are typically isolated from each other by isolation regions such as trench isolation regions.

Figure 1A:
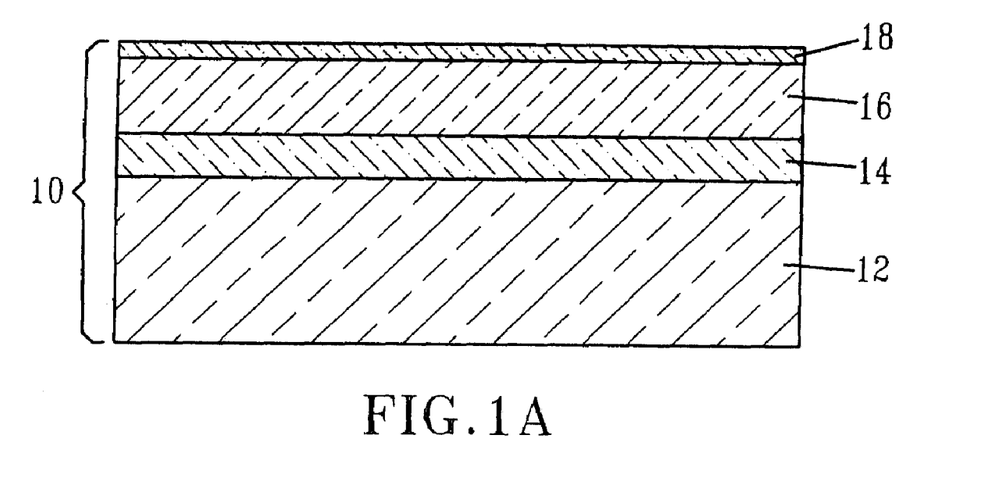
FIGS. 1A-1D are pictorial representations (through cross sectional views) illustrating the basic processing steps that are employed in the first method of the present invention.

Reference is first made to the initial structure 10 (i.e., a partial resistor) shown in FIG. 1A. The initial structure 10 includes a semiconductor substrate 12, an optional first dielectric layer 14 located on the semiconductor substrate 12, a polysilicon, i.e., polySi, or polysilicon germanium, i.e. polySiGe, (hereinafter Si-containing) layer 16 located on either the optional first dielectric layer 14 or the semiconductor substrate 12, and a second dielectric 18 located atop the Si-containing layer 16.

The semiconductor substrate 12 of the initial structure 10 shown in FIG. 1A comprises any semiconductor material including, but not limited to: Si, Ge, SiGe, SiC, SiGeC, Ga, GaAs, InAs, InP, silicon-on-insulators, SiGe-on-insulators and all other III/V compound semiconductors. Of these semiconducting materials, it is highly preferred that semiconductor substrate 12 be composed of a Si-containing semiconductor.

The semiconductor substrate 12 may be doped, undoped or contain doped and undoped regions therein. The semiconductor substrate may be strained, unstrained or a combination thereof. Moreover, the semiconductor substrate 12 can have any crystallographic orientation, such as, for example, (100), (111), or (110). The semiconductor substrate 12 may contain active device regions and/or device isolation regions embedded in the surface thereof. For clarity, such regions are not shown in FIG. 1A, but nevertheless the same could be present in the semiconductor substrate 12. For example, the Si-containing layer 16 can be formed directly atop an isolation region such as a trench isolation region or field oxide region that is present in, or on, the substrate 12. In such an embodiment, the optional first dielectric layer 14 is not typically formed on the isolation region.

When present, the optional first dielectric layer 14 is composed of any material that is capable of serving as an insulator between the semiconductor substrate 12 and the activated resistor region 16a to be subsequently formed. The present invention thus contemplates the use of inorganic as well as organic dielectric materials as the optional first dielectric layer 14. Suitable dielectric materials for use as the optional first dielectric layer 14 include, but are not limited to: SiO$_2$, Si$_3$N$_4$, perovskite-type oxides such as barium strontium titanate, diamond, diamond-like carbon, polyimides, silicon-containing polymers and other like dielectric materials. Of the dielectric materials mentioned above, it is highly preferred that the optional first dielectric layer 14 be composed of $SiO_2$ or $Si_3N_4$.

Optional first dielectric layer 14 is formed on the surface of the semiconductor substrate 12 by either growing the dielectric layer using a thermal growth process or by depositing the dielectric layer using a deposition technique such as, for example, chemical vapor deposition (CVD), plasma-assisted chemical vapor deposition, spin-on coating, dip coating and other deposition processes known to those skilled in the art. While not critical to the present invention, the final thickness of the optional first dielectric layer 14 is typically from about 100 to about 3000 Å. If needed, the structure containing the semiconductor substrate 12 and the optional first dielectric layer 14 can be planarized using a planarization technique known to those skilled in the art such as, for example, chemical-mechanical polishing (CMP) or grinding. Next, the Si-containing layer 16 is formed on the surface of the optional first dielectric layer 14 or the semiconductor substrate 12 (when the optional first dielectric layer 14 is not present) using a deposition technique known to those skilled in the art. For example, chemical vapor deposition, plasma-assisted chemical vapor deposition or sputtering may be used to form the Si-containing layer 16. Alternatively, the Si-containing layer 16 can be formed by an epitaxial
growth process. As indicated above, the term "Si-containing layer" refers to either polySi or polySiGe. In one embodiment of the present invention, it is preferred that the Si-containing layer 16 is comprised of polysi.

The Si-containing layer 16 formed outside the resistor device region can be used in forming the emitter or base of a bipolar transistor, and/or a gate conductor of a CMOS device. In those areas, and in the first method of the present invention, the other device regions have been processed to a point in which the dopant regions, particularly the source/drain dopants, have been activated by utilizing a thermal anneal process such as a rapid thermal anneal (RTA). Standard rapid thermal anneals are typically performed at 900° C. or above, for 30 seconds or less.

A highly preferred means for depositing the Si-containing layer 16 is by the pyrolysis of a silane with, or without, a germanium source, at low temperatures such as between 600° to 750° C. The thickness of the Si-containing layer 16, which is also not critical to the present invention, is typically from about 500 to about 3000 Å.

A second dielectric 18, which is comprised of an inorganic dielectric such as an oxide, nitride, oxynitride or any combination thereof, is then formed atop the Si-containing layer 16. The second dielectric layer 18 is preferably an oxide such as $SiO_2$. The second dielectric layer 18 is formed utilizing one of the techniques mentioned above in forming the optional first dielectric layer 14.

Figure 1B:
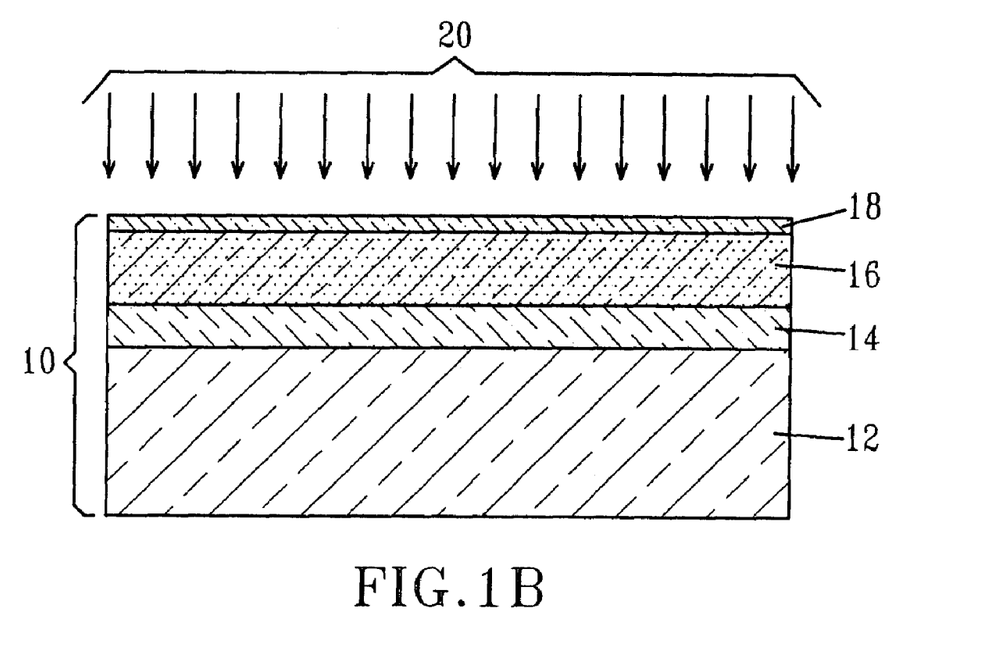

Dopant ions 20 are then implanted into the Si-containing layer 16 of each resistor device region through the second dielectric layer 18 as shown in FIG. 1B. In this method of the present invention, the dopant ions 20 are implanted using an ion dose that is about $10^{14}$ (i.e., 1E14) atoms/$cm^2$ or greater, with an ion dose from about $10^{15}$ to about $2\times10^{16}$ atoms/$cm^2$ being more typical. The dopant ions 20 are implanted to provide a dopant concentration from about $10^{18}$ to about $10^{21}$ atoms/$cm^3$ within the Si-containing layer 16 in each resistor device region. The particular doping concentration can be selected to provide a predetermined and desired resistance value to the Si-containing layer 16.

Any conventional n- or p-type dopant ion may be used at this point of the present invention. Thus, the present invention is capable of forming p−, p+, n−, or n+ resistors. Preferably, p+ resistors, particularly polySi, are formed in the present invention. Typical p-type dopants include an element from Group IIIA of the Periodic Table of Elements, while typical n-type dopants include an element from Group VA of the Periodic Table of Elements.

In an embodiment of the first method of the present invention, the high ion dose implant step described above can be avoided and thus eliminated, if a highly doped in-situ Si-containing layer is used. The term "highly doped" denotes a dopant concentration of about $10^{20}$ atoms/$cm^3$ or greater. Thus, in the first method, an in-situ doped Si-containing layer can be formed in place of the undoped Si-containing layer 16. The in-situ doped Si-containing layer is formed utilizing any in-situ doping deposition process that is well known to those skilled in the art.

Figure 1C:
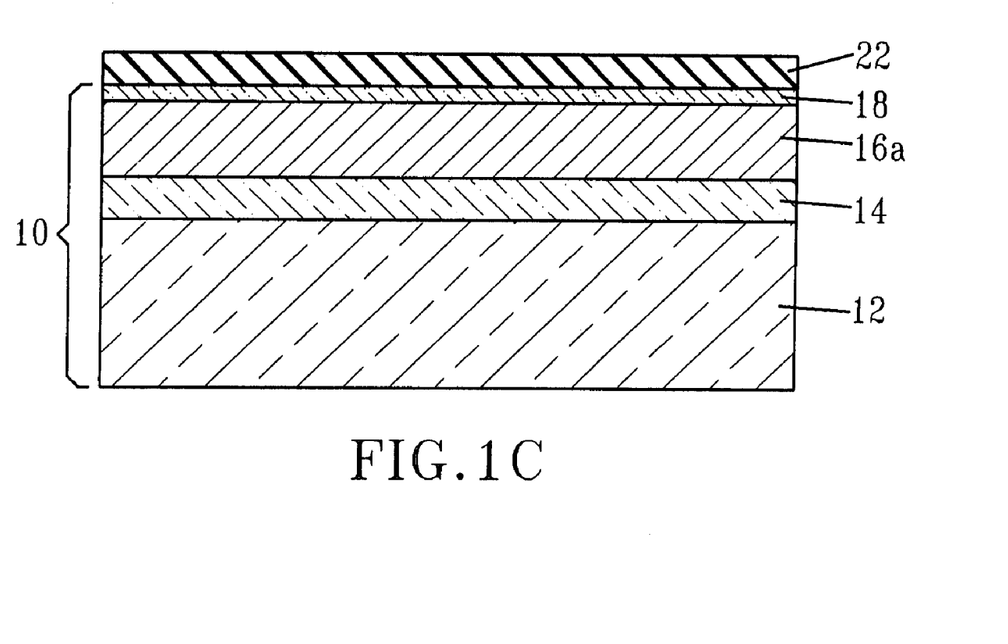

Referring back to the basic process flow being depicted in FIGS. 1A-1D and after doping of the Si-containing layer 16 within each resistor device region, the dopants within the Si-containing layer 16 are activated. In accordance with the first method of the present invention, dopants within the Si-containing layer 16 are activated by depositing a protective dielectric layer 22 on the surface of the doped Si-containing layer 16. FIG. 1C shows the structure after deposition of the protective dielectric layer 22. Note that in the structure dopants within the Si-containing layer are activated. In the drawing, reference numeral 16a denotes the activated Si-containing layer.

In accordance with the first method of the present invention, the deposition of the protective dielectric layer 22 is thus performed at a temperature that will activate the dopants within the Si-containing layer 16. Specifically, the deposition of the protective dielectric layer 22 is performed at a temperature of about 700° C. or greater, with a temperature from about 700° to about 800° C. being more typical. Any deposition technique that can form the protective dielectric layer 22 within the above mentioned temperature range thus can be employed. For example, a rapid thermal chemical vapor deposition process can be utilized. Alternatively, low pressure chemical vapor deposition can be used to deposit the protective dielectric layer 22, while activating the dopants within the Si-containing layer 16.

The protective dielectric layer 22 is typically comprised of an inorganic dielectric that differs from the second dielectric layer 18. In particular, the protective dielectric layer 22 is comprised of an oxide, nitride, oxynitride or any combination thereof, including multilayers. The protective dielectric layer 22 is typically a nitride such as SiN. The thickness of the protective dielectric layer 22 may vary depending on the type of material and deposition process employed in forming the same. Typically, the protective dielectric material has a thickness from about 10 to about 1000 Å.

In some embodiments of the first method of the present invention, the second dielectric layer 18 and the protective dielectric 22 are then patterned by lithography and etched to expose end surface regions of the doped Si-containing layer 16a. A conductive metal that is capable of being converting into a silicide by reacting with the underlying and contacting activated Si-containing layer 16a is then formed on each exposed end surface region. Examples of conductive metals that can be employed in the present invention include, but are not limited to: Ni, Ti, W, Co, and other like metals, including alloys thereof. Highly preferred metals include Ni and Co. The thickness of the conductive metal formed at this point of the present invention may vary. A typical thickness range for the conductive metal is from about 100 to about 500 Å.

The conductive metals are typically formed utilizing any deposition process known to those skilled in the art. Illustrative examples of suitable deposition processes that can be used in forming the conductive metal include, but are not limited to: sputtering, atomic layer deposition, evaporation, chemical vapor deposition, chemical solution deposition and other like deposition processes.

After conductive metal deposition, the structure is subjected to a silicidation anneal, which may include a one or two-step anneal. The silicidation annealing conditions may vary depending on the conductive metal that was previously deposited. Such annealing conditions are well known to those skilled in the art. The silicidation anneal may also be used to aid in the activation of the dopants within the doped Si-containing layer 16.

The silicide anneals are self-aligned processes that are carried out in a gas atmosphere, e.g., He, Ar, Ne, $N_2$ and/or forming gas. The silicide annealing steps may use different atmospheres or the annealing steps may be carried out in the same atmosphere. For example, He may be used in both annealing steps, or He can be used in the first annealing step and a forming gas may be used in the second annealing step.

The one step anneal is performed at a temperature from about 300° to about 800° C. More preferably, the one step anneal is performed at a temperature from about 500° to about 700° C. The one step anneal is typically employed when Ni is used as the conductive metal and temperatures down to 300° C. can be utilized. An etching step may follow the one step silicide anneal to remove any unreacted metal from the structure.

The two-step annealing process includes a first annealing step and a second annealing step. An etching step is typically performed between the two anneals to remove any unreacted metal. Typically, the first annealing step, which forms a high resistance silicide phase material, is performed at a temperature from about 400° to about 600° C. using a continuous heating regime or various ramp and soak heating cycles. More preferably, the first annealing step is performed at a temperature from about 450° to about 550° C. The second annealing step is performed at a temperature from about 600° C. to about 900° C. using a continuous heating regime or various ramp and soak heating cycles. More preferably, the second annealing step is performed at a temperature from about 700° C. to about 800° C. for cobalt conversion to a final low resistivity $CoSi_2$ phase. The second anneal converts the high resistance silicide into a silicide phase of lower resistance and these temperatures are well known by those skilled in the art for various conductive metals.

Figure 1D:
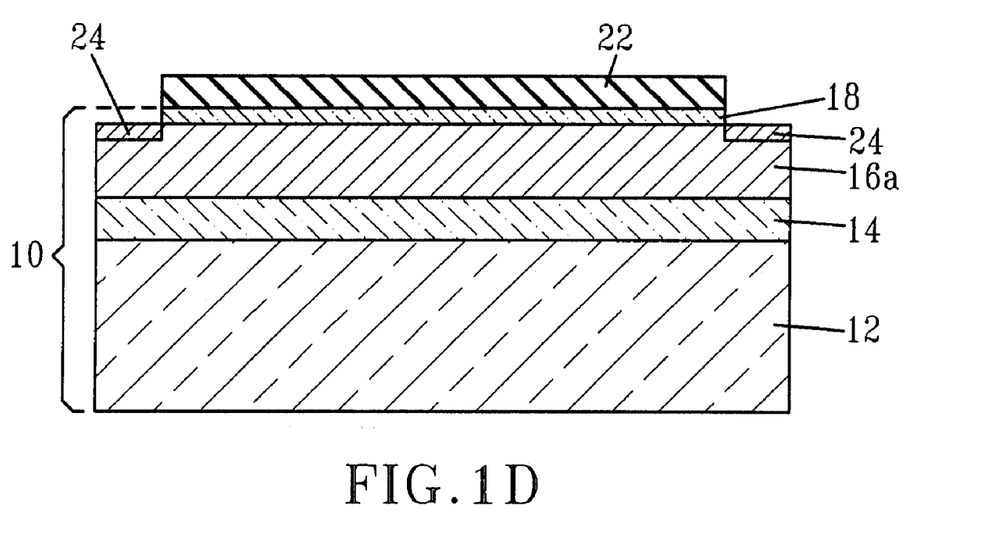

The resultant structure after the silicide anneals have been performed is shown, for example, in FIG. 1D. Reference numeral 24 denotes the silicide contact regions formed utilizing the above steps. The precision resistor includes layers 18, 16a, and 12.

Depending on the device being manufactured, it is possible to complete formation of the bipolar transistors and/or CMOS devices after silicide formation using well-known FEOL (front-end-of-the-line) processes. Additionally, a conventional BEOL (back-end-of-the-line) process may be employed at this point of the present invention to connect the silicide contact regions of the resistor to an external wire.

FIGS. 2A-2D illustrates a second method of the present invention. The second method of the present invention begins with providing the structure 50 shown in FIG. 2A. Specifically, structure 50 includes a semiconductor substrate 12, an optional first dielectric 14 located on a surface of the semiconductor substrate 12, a Si-containing layer 16 on a surface of the optional first dielectric layer 16 or the semiconductor substrate 12, a second dielectric layer 18 located on the Si-containing layer 16 and a protective dielectric layer 22 located on the second dielectric layer. Structure 50 including layers 12, 14, 16 and 18 is formed using the processing steps described above in regard to the first method; see, particularly FIG. 1A and related text. The dielectric protective layer 22 can be formed utilizing the processes described in the first method. Alternatively, other deposition processes including lower deposition techniques can be used in forming the protective dielectric layer 22. In this embodiment, the dopant regions, i.e., source/drain diffusions, of the other device regions are activated prior to forming the protective dielectric layer 22.

Figure 2A:
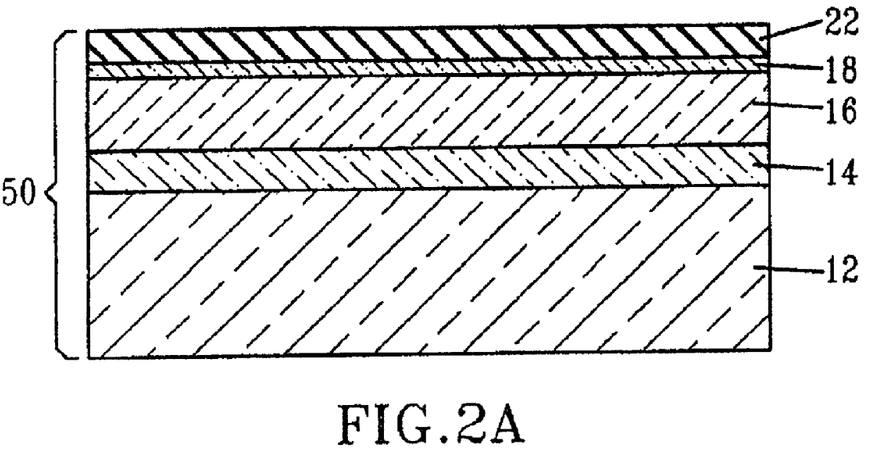
FIGS. 2A-2D are pictorial representations (through cross sectional views) illustrating the basic processing steps that are employed in the second method of the present invention.
Figure 2B:
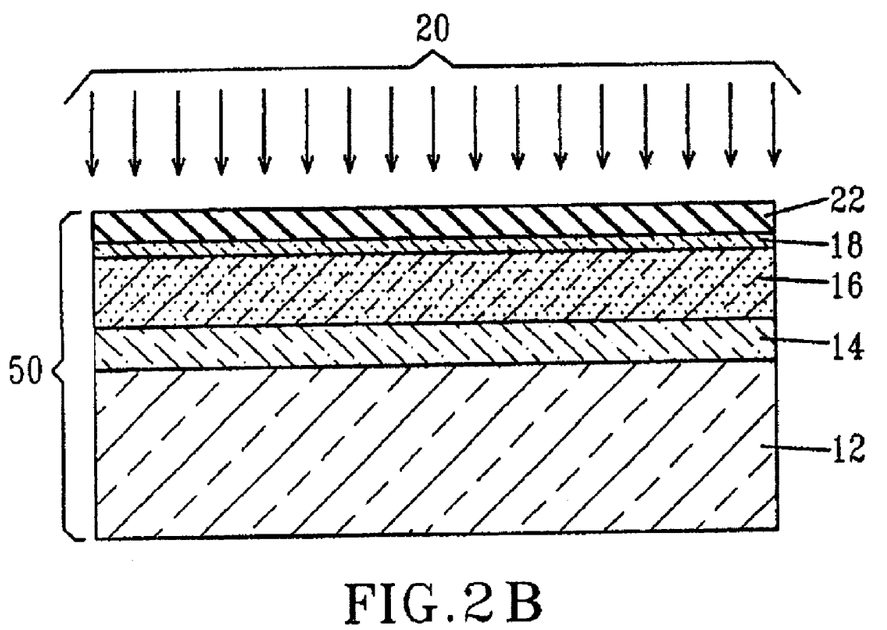

Dopant ions 20, see FIG. 2B, are then implanted into the Si-containing layer 16 through the protective dielectric layer 22 and the second dielectric layer 18. In this method of the present invention, the dopant ions 20 are implanted using an ion dose that from about $10^{14}$ to about $2\times10^{16}$ atoms/cm$^2$, with an ion dose from about $10^{15}$ to about $2\times10^{16}$ atoms/cm$^2$ being more typical. The dopant ions 20 are implanted to provide a dopant concentration from about $10^{18}$ to about $10^{21}$ atoms/cm$^3$ within the Si-containing layer 16 in each resistor device region. The particular doping concentration can be selected to provide a predetermined and desired resistance value to the Si-containing layer 16.

Any conventional n- or p-type dopant ion may be used at this point of the present invention. Thus, the present invention is capable of forming p–, p+, n–, or n+ resistors. Preferably, p+ resistors, particularly polysi, are formed in the present invention. Typical p-type dopants include elements from Group IIIA of the Periodic Table of Elements, while typical n-type dopants include elements from Group VA of the Periodic Table of Elements.

A separate anneal is then used to activate the dopants within the Si-containing layer 16, the anneal is typically carried out at this point of the second method of the present invention using a furnace anneal or a rapid thermal anneal (RTA). Typically, this annealing step is carried out in an inert gas atmosphere, e.g., He, Ar, Ne and/or $N_2$, which may be mixed with less than about 10% oxygen. It is also possible to use an oxidizing ambient in place of an inert gas atmosphere during the annealing of the resistor.

The exact temperatures and times of annealing vary depending on the annealing technique used as well as the type of dopant found in layer 16. For example, when a furnace anneal is employed and boron is used as the dopant species, annealing is carried out at a temperature of about 900° C. for a time period of about 20 minutes. For the same dopant species, RTA is carried out at about 950° C. for about 7 seconds. On the other hand, when As is the dopant species, the furnace anneal is carried out at about 750° C. for about 20 minutes. Reduced annealing times can be employed when RTA is used in activating As. In general terms, the separate activation anneal is performed at a temperature of about 600° C. to 800° C. in order to limit the effects from this additional thermal cycle on any other devices such as transistors, capacitors, diodes or even other resistors already formed on the substrate. It is noted that the maximum temperature that one could utilize depends solely on the temperature sensitivity of the other devices such as transistors, capacitors, diodes or even other resistors already formed on the substrate. This sensitivity tends to lower the maximum temperature of this additional anneal to around 800° C.

Figure 2C:
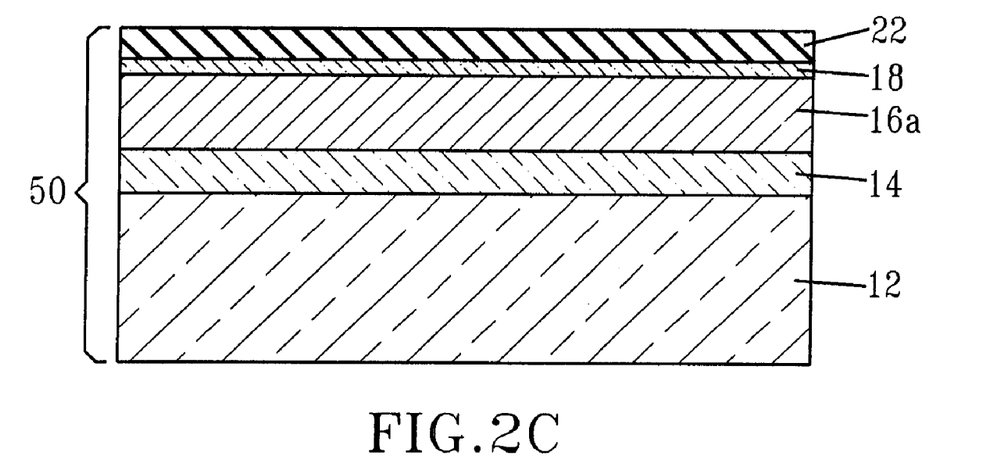
Figure 2D:
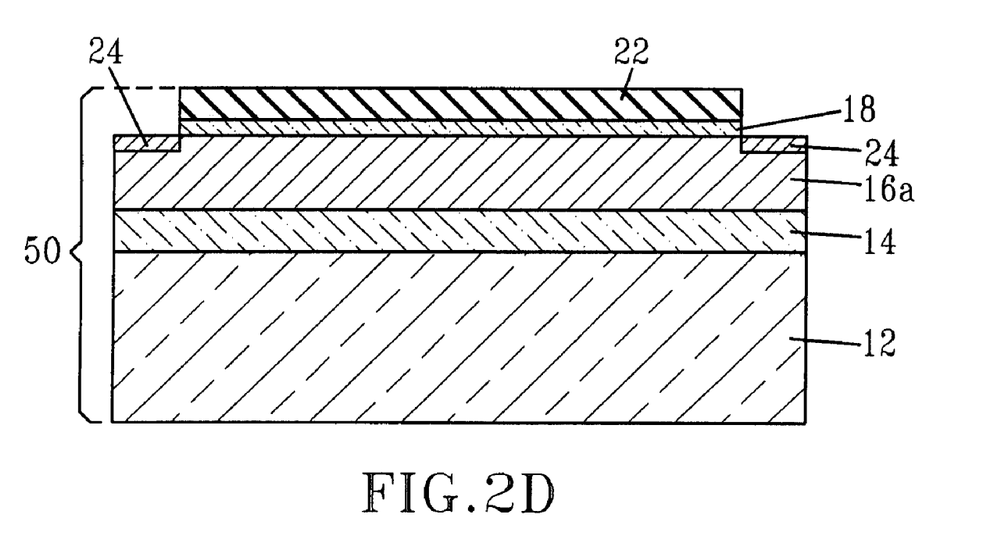

The resultant structure including the activated Si-containing layer 16a is shown in FIG. 2C. In some embodiments of the present invention, the protective dielectric layer 22 and the second dielectric layer 18 are then patterned by lithography and etched to expose end surface regions of the activated Si-containing layer 16a. A conductive metal, such as described above in the first method of the present invention, that is capable of being converted into a silicide by reacting with the underlying and contacting activated Si-containing layer 16a is then formed on each exposed end surface region.

After conductive metal deposition, the structure is subjected to a silicidation anneal, which may include a one or two-step anneal, as described above. The resultant structure after the silicide anneals have been performed is shown, for example, in FIG. 2D. Reference numeral 24 denotes the silicide contact regions formed utilizing the above steps. The precision resistor includes layers 18, 16a, and 12.

Depending on the device being manufactured, it is possible to complete formation of the bipolar transistors and/or CMOS devices after silicide formation using well-known FEOL (front-end-of-the-line) processes. Additionally, a conventional BEOL (back-end-of-the-line) process may be employed at this point of the present invention to connect the silicide contact regions of the resistor to an external wire.

Figure 3A:
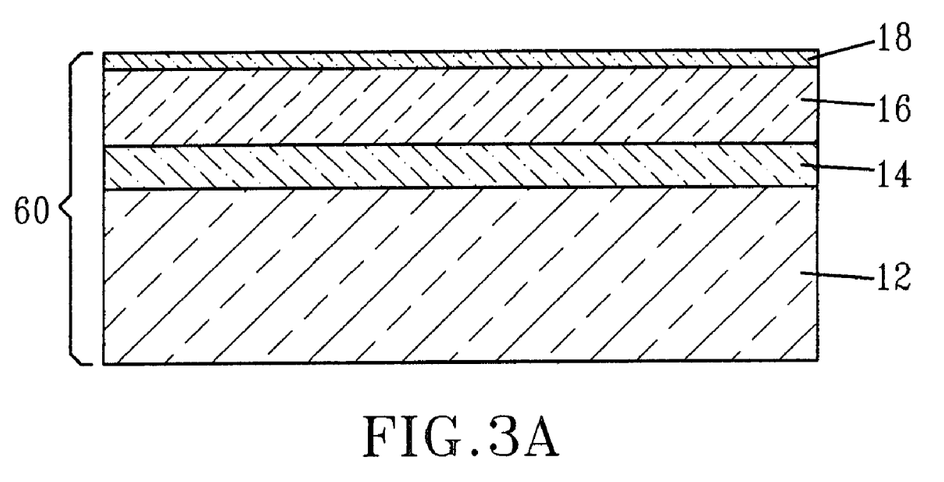
FIGS. 3A-3D are pictorial representations (through cross sectional views) illustrating the basic processing steps employed in the third method of the present invention.

FIGS. 3A-3D shows a third method of the present invention. Unlike the two methods described above, the dopant regions within the other device regions are inactivated during the implantation of the Si-containing layer. FIG. 3A shows an initial structure 60 that includes semiconductor substrate 12, optional first dielectric layer 14, Si-containing layer 16, and second dielectric layer 18. The structure 60 is formed as described in the first method of the present invention; See, in particular, FIG. 1A and related text.

Figure 3B:
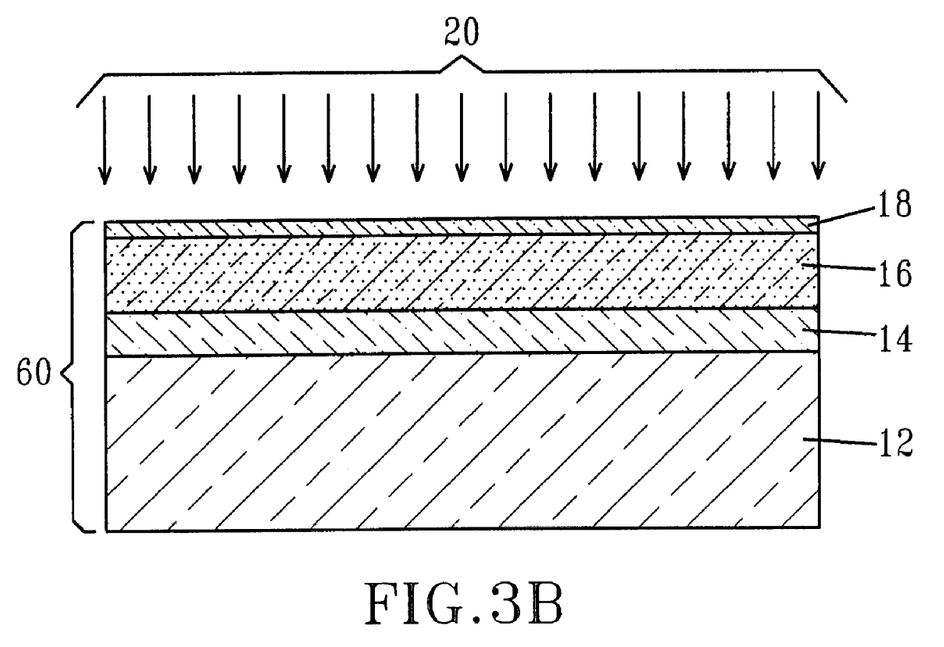

The Si-containing layer 16 is then doped within dopant ions 20, as shown in FIG. 3B, utilizing an ion dose of about 1E16 atoms/cm$^2$ or greater, with an ion dose from about 1E16 to about to about 4e16 atoms/cm$^2$ being more typical. The dopant ions 20 are implanted to provide a dopant concentration from about $10^{20}$ to about $10^{22}$ atoms/cm$^3$ within the Si-containing layer 16 in each resistor device region. The particular doping concentration can be selected to provide a predetermined and desired resistance value to the Si-containing layer 16.

Any conventional n- or p-type dopant ion may be used at this point of the present invention. Thus, the present invention is capable of forming p+ or n+ resistors. Preferably, p+ resistors, particularly polySi, are formed in the present invention. Typical p-type dopants include elements from Group IIIA of the Periodic Table of Elements, while typical n-type dopants include elements from Group VA of the Periodic Table of Elements.

A separate anneal is then used to activate the dopants within the Si-containing layer 16 as well as the inactivated dopants within the other device regions, the anneal is typically carried out at this point of the second method of the present invention using a furnace anneal or a rapid thermal anneal (RTA). Typically, this annealing step is carried out in an inert gas atmosphere, e.g., He, Ar, Ne and/or N$_2$, which may be mixed with less than about 10% oxygen. It is also possible to use an oxidizing ambient in place of an inert gas atmosphere during the annealing of the resistor.

The exact temperatures and times of annealing vary depending on the annealing technique used as well as the type of dopant found in layer 16. For example, when a furnace anneal is employed and boron is used as the dopant species, annealing is carried out at a temperature of about 900° C. for a time period of about 20 minutes. For the same dopant species, RTA is carried out at about 950° C. for about 7 seconds. On the other hand, when As is the dopant species, the furnace anneal is carried out at about 750° C. for about 20 minutes. Reduced annealing times can be employed when RTA is used in activating As. In general terms, the separate anneal is performed at a temperature of about 600° C. or above.

Figure 3C:
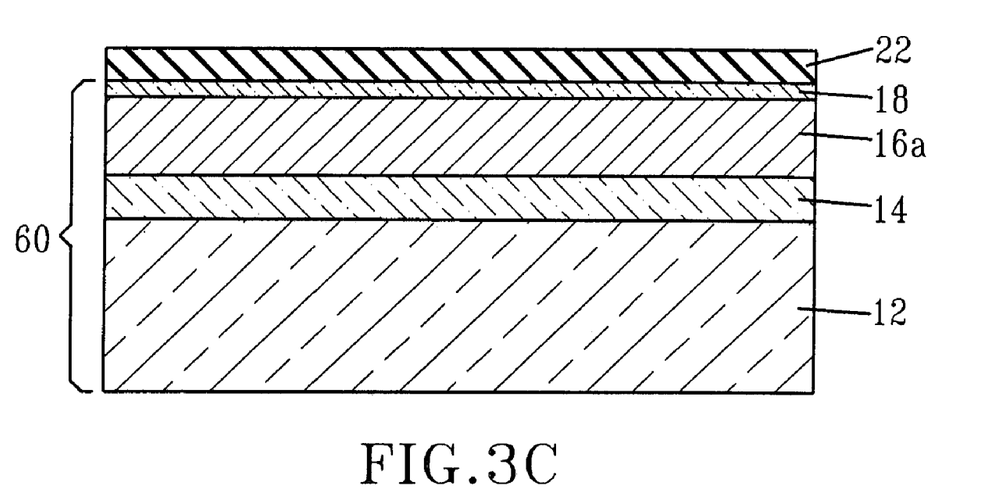
Figure 3D:
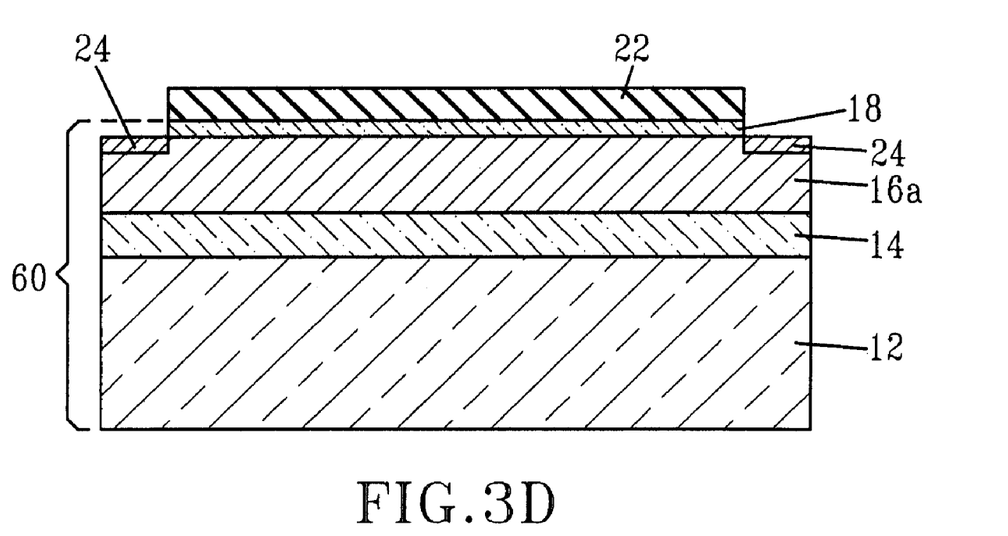

FIG. 3C shows the structure after an optional protective dielectric layer 22 is formed on the surface of the now activated Si-containing layer 16a, while FIG. 3D shows the structure after siliciding the ends of the activated Si-containing layer 16a. The silicide area is denoted by reference numeral 24.

Figure 4:
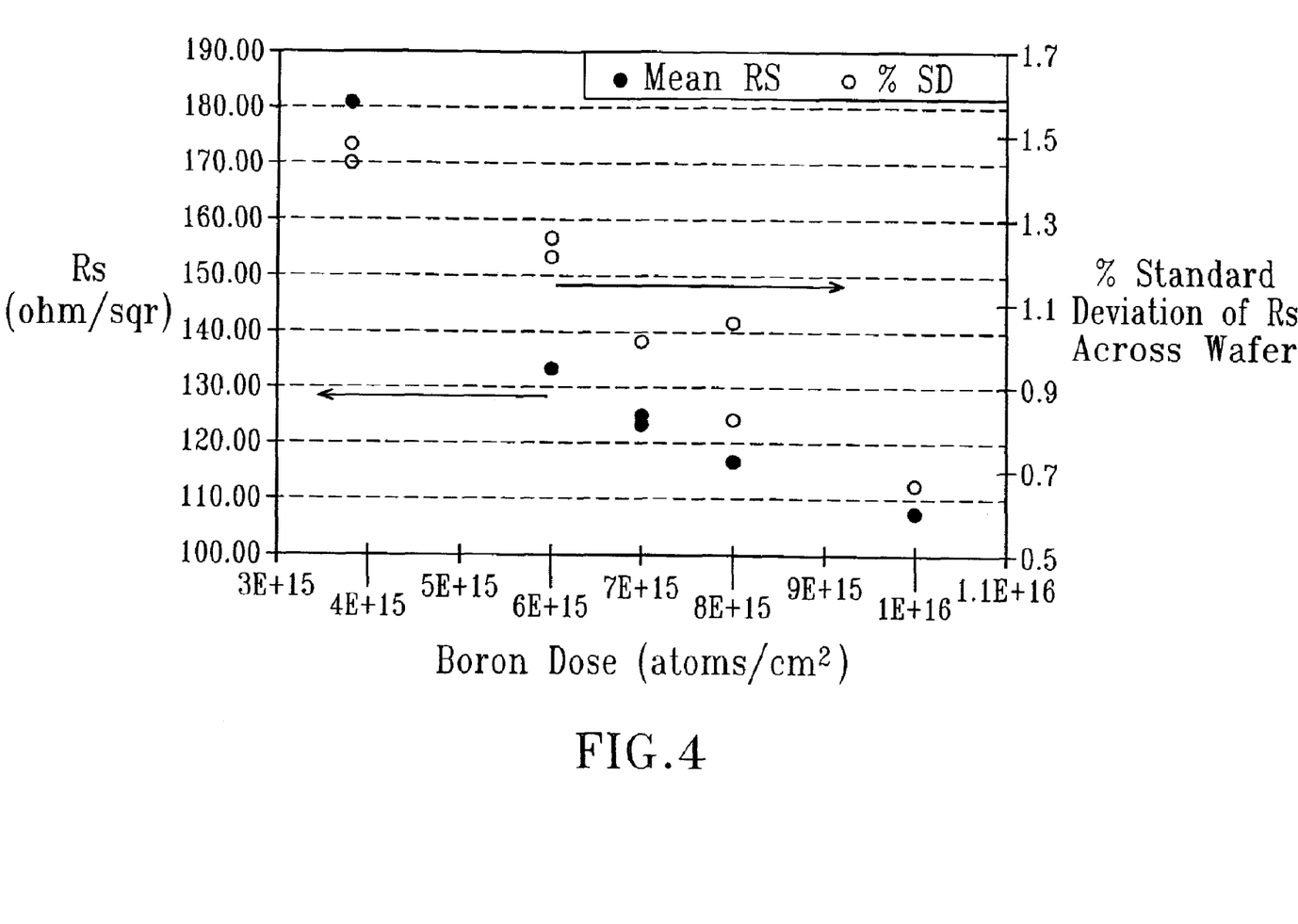
FIG. 4 is a plot of Across Wafer % Standard Deviation vs. Boron Implant Dose that was obtained using the third method of the present invention.

FIG. 4 is a plot of Across Wafer % Standard Deviation vs. Boron Implant Dose that was obtained using the third method of the present invention. This plot shows that one observes better across wafer variation as the implant doses increase. This correlates to better tolerance control. The minimum dose on the x-axis was 3E15 and the maximum does was 1E16 atoms/cm$^2$. The results were generated on a wafer containing a 2000 Å polysilicon layer in which the boron implants were performed at 30 keV. After boron implantation, an anneal (988° C., 5 secs) was employed to active the boron dopant. A standard 4-point probe resistance measurement was taken on 49 sites across the wafer.

While the present invention has been described and shown with respect to preferred embodiments thereof, it will be understood by those skilled in the art that the foregoing and other changes in forms and details may be made without departing from the spirit and scope of the present application. It is therefore intended that the present application not be limited to the exact forms described and illustrated, but fall within the scope of the appended claims.

What is claimed is:

1. A method of fabricating a precision Si-containing resistor comprising:
   providing a structure that includes at least one resistor device region and at least one other type of device region, wherein said at least one resistor device region comprises a Si-containing layer and said at least one other type of device region having activated dopant regions formed therein;
   implanting a first conductivity type dopant at an ion dose of about 1E14 atoms/cm$^2$ or greater into said Si-containing layer, and
   forming a protective dielectric layer atop said Si-containing layer in the at least one resistor device region at a temperature at which said first conductivity type dopant within the Si-containing layer is activated.

2. The method of claim 1 wherein said Si-containing layer comprises at least one of polysilicon or polySiGe.

3. The method of claim 1 wherein said first conductivity type dopant is a p-type dopant.

4. The method of claim 1 wherein said ion dose is from about 1E15 to about 2E16 atoms/cm$^2$.

5. The method of claim 1 wherein said temperature of forming said protective dielectric layer is about 700° C. or greater.

6. The method of claim 5 wherein said forming said protective dielectric layer comprises a rapid thermal chemical vapor deposition process.

7. The method of claim 1 thither comprising subjecting said structure to a silicidation step.

8. The method of claim 1 wherein said Si-containing layer is formed by an in-situ doping deposition process and thus eliminating the implanting step.

9. A method of fabricating a precision Si-containing resistor comprising:

providing a structure that includes at least one resistor device region and at least one other type of device region, wherein said at least one resistor device region comprises a Si-containing layer and said at least one other type of device region having activated dopant regions formed therein;

implanting a first conductivity type dopant into said Si-containing layer;

forming a protective dielectric layer atop said Si-containing layer in the at least one resistor device region after said implanting of said first conductivity type dopant, wherein said implanted first conductivity type dopant is activated during said forming of said protective dielectric layer; and performing a silicide process at a temperature of about 700° C. or less.

10. The method of claim 9 wherein said Si-containing layer comprises at least one of polysilicon or polySiGe.

11. The method of claim 9 wherein said first conductivity type dopant is a p-type dopant.

12. The method of claim 9 wherein said implanting comprises an ion dose from about 1E14 to about 2E16 atoms/cm$^2$.

13. The method of claim 9 wherein said suicide process is a NiSi process performed at a temperature of about 400° C. or less.

14. A method of fabricating a precision Si-containing resistor comprising:

providing a structure that includes at least one resistor device region and at least one other type of device region, wherein said at least one resistor device region comprises a Si-containing layer and said at least one other type of device region has an inactivated dopant region;

implanting a first conductivity type dopant into said Si-containing layer at an ion dose of about 1E16 atoms/cm$^2$ or greater; and subjecting said structure to an activation anneal, wherein said activation anneal activates the first conductivity type dopant within the Si-containing layer as well as the inactivated dopant region.

15. The method of claim 14 wherein said Si-containing layer comprises at least one of polysilicon or polySiGe.

16. The method of claim 14 wherein said first conductivity type dopant is a p-type dopant.

17. The method of claim 14 wherein said implanting comprises an ion dose from about 1E16 to about 4E16 atoms/cm$^2$.

18. The method of claim 14 further comprising a step of forming a protective dielectric hyer.

19. The method of claim 14 further comprising a step of subjecting said structure to a silicidation process after said activation anneal.

* * * * *